(12) United States Patent
Fuderer

(10) Patent No.: US 8,278,924 B2
(45) Date of Patent: Oct. 2, 2012

(54) METHOD OF PERFORMING AN MRI REFERENCE SCAN

(75) Inventor: Miha Fuderer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/741,050

(22) PCT Filed: Nov. 3, 2008

(86) PCT No.: PCT/IB2008/054554
§ 371 (c)(1),
(2), (4) Date: May 3, 2010

(87) PCT Pub. No.: WO2009/060367
PCT Pub. Date: May 14, 2009

(65) Prior Publication Data
US 2010/0240984 A1  Sep. 23, 2010

(30) Foreign Application Priority Data
Nov. 8, 2007  (EP) ................................. 07120230

(51) Int. Cl.
*G01V 3/00* (2006.01)
(52) U.S. Cl. ...................................................... 324/307
(58) Field of Classification Search .......... 324/300–322; 600/407–445
See application file for complete search history.

(56) References Cited

U.S. PATENT DOCUMENTS

| | | | |
|---|---|---|---|
| 5,614,827 A * | 3/1997 | Heid .............................. | 324/320 |
| 6,275,038 B1 | 8/2001 | Harvey | |
| 6,392,412 B1 | 5/2002 | Nauerth | |
| 6,995,560 B2 * | 2/2006 | Duerk et al. .................. | 324/310 |
| 7,015,696 B2 | 3/2006 | Kabasawa | |
| 7,042,215 B2 * | 5/2006 | Moriguchi et al. ........... | 324/307 |
| 7,741,842 B2 * | 6/2010 | McKenzie et al. ............ | 324/307 |
| 7,777,486 B2 * | 8/2010 | Hargreaves et al. .......... | 324/309 |

(Continued)

FOREIGN PATENT DOCUMENTS

DE  10319037 A1  11/2004

(Continued)

OTHER PUBLICATIONS

Glover: "Multipoint Dixon Technique for Water and Fat Proton and Susceptibility Imaging"; Journal of Magnetic Resonance Imaging, vol. 1, 1991, pp. 521-530.

(Continued)

*Primary Examiner* — Dixomara Vargas

(57) ABSTRACT

The invention relates to a method of performing a magnetic resonance imaging (MRI) reference scan of an examination volume comprising a plurality of image points, the method being performed using a set of detector elements (142), the method comprising: phase sensitive acquisition of a first and a second complex echo signal originating from a first (214; 306; 310) and second (216; 308; 312) echo for each image point, wherein the acquisition is performed by each of the detector elements of the set of detector elements (142), determining for a detector element of the set of detector elements (142) a phase difference between the first and the second echo signal for each image point, —calculating from the phase difference a local magnetic field inhomogeneity value for each image point, deriving for each image point a coil sensitivity matrix, wherein the coil sensitivity matrix is derived by calculating complex ratios of the first or the second complex echo signals acquired by the set of elements.

14 Claims, 4 Drawing Sheets

U.S. PATENT DOCUMENTS

| | | | |
|---|---|---|---|
| 7,843,195 B2 * | 11/2010 | Ruhm | 324/309 |
| 7,999,543 B2 * | 8/2011 | Dahnke et al. | 324/309 |
| 2007/0247154 A1 | 10/2007 | McKenzie et al. | |
| 2010/0240984 A1 * | 9/2010 | Fuderer | 600/410 |
| 2011/0001474 A1 * | 1/2011 | Miller et al. | 324/306 |

FOREIGN PATENT DOCUMENTS

| | | |
|---|---|---|
| EP | 0545465 A1 | 6/1993 |
| EP | 1477824 A2 | 11/2004 |
| WO | 2005069032 A1 | 7/2005 |
| WO | 2006018780 A1 | 2/2006 |

OTHER PUBLICATIONS

Moriguchi et al: "Spiral Dixon Techniques Using Sensitivity Encoding"; Proceedings of the International Society for Magnetic Resonance in Medicine, vol. 11, 2004, p. 2683.

Moriguchi et al: "Dixon Techniques in Spiral Trajectories With Off-Resonance Correction: A New Approach for Fat Signal Suppression Without Spatial-Spectral RF Pulses"; Magnetic Resonance in Medicine, vol. 50, 2003, pp. 915-924.

Sutton et al: "Iterative MR Image Reconstruction Using Sensitivity and Inhomogeneity Field Maps"; Proceedings of the International Society for Magnetic Resonance in Medicine, vol. 9, 2001, p. 771.

Hammond et al: "Comparison of the B0 Field and Shimming in Human Brains at 3T and 7T"; Proceedings of the International Society for Magnetic Resonance in Medicine, vol. 14, 2006, p. 2352.

Brau et al: "Accelerated Ideal Water-Fat Separation Techniques for Single-And Multi-Coil Applications"; Proceedings of the International Society for Magnetic Resonance in Medicine, vol. 13, 2005, p. 491.

Schar et al: "Cardiac SSFP Imaging at 3 TESLA"; Magnetic Resonance in Medicine, vol. 51, 2004, pp. 799-806.

Schneider et al: "Rapid in Vivo Proton Shimming"; Magnetic Resonance in Medicine, vol. 18, No. 2, Apr. 1991, pp. 335-347.

\* cited by examiner

METHOD OF PERFORMING AN MRI REFERENCE SCAN

FIELD OF THE INVENTION

The invention relates to a method of performing a magnetic resonance imaging reference scan, a magnetic resonance imaging apparatus adapted for reference scanning of an examination volume and a computer program product.

BACKGROUND AND RELATED ART

Magnetic resonance imaging (MRI) is one of the major imaging techniques in medicine. MRI is capable of generating detailed images of soft tissues. In MRI, specific properties of the various compounds found inside tissues are used to generate images, e.g., water is most commonly used for this purpose. When subjected to a strong external magnetic field, the protons $^1$H will align with this external field, resulting in a magnetic moment. After excitation by radio frequency RF pulses, this magnetization will generate an RF signal that can be detected. This RF signal is characterized by a frequency that is related to the magnetic field strength. Therefore, magnetic field gradients are used to encode a spatial information which is needed to reconstruct the image from detected signals.

One prerequisite for performing MRI in a highly accurate manner is the exact knowledge of local magnetic field inhomogeneities within the examination volume, the sensitivities of the used coils to detect RF signals generated by the above mentioned magnetization, as well as to have detailed information about coil timings or in other words to know how quickly a coil is able to detect RF signals at highest accuracy after having been turned on.

Knowing the MR field inhomogeneities allows to largely correct them, e.g. by application of higher-order shimming. Homogeneity of the magnetic field can be important for a variety of reasons. One of them is spectroscopy, but also in MR imaging (the primary focus of our attention here) it is important for some sequences, e.g., balanced field-echo techniques (also abbreviated as bFFE, a.k.a. true-FISP a.k.a. FIESTA), but also the separation between water and fat—most notably for the techniques of fat suppression.

The reason why a coil sensitivity with respect to an image point of an examination volume has to be known is that, for example coils have the property of decreasing reception sensitivity with increasing distance from the magnetic resonance signal source, wherein said sensitivity distribution is not uniform over the whole imaged examination volume. This is an extremely important issue especially in the case, where multiple reception coils record signals from the same image point in an examination volume. In this case, received signals from said multiple reception coils have to be weighted in such a manner, that a uniform magnetic resonance image is obtained using the information from all coils.

For example, WO 2006/018780 A1 discloses a magnetic resonance (MR) method for a quantitative determination of local relaxation time values in an examination volume. Thereby, local magnetic field inhomogeneity values are calculated from local resonance frequency values measured with a plurality of echo signals.

EP 0545465 A1 discloses a fast and simple shimming method which utilizes only one measuring sequence.

U.S. Pat. No. 6,275,038 B1 discloses a method for evaluating an inhomogeneity in a magnetic polarizing field used to acquire an MRI image of a slice of a subject at a point in the slice. Thereby, by using phase differences between values of a first and second spatial image at said point, magnetic field inhomogeneities are evaluated.

U.S. Pat. No. 7,015,696 B2 discloses a method for calculating a sensitivity distribution of a receive coil.

SUMMARY OF THE INVENTION

The present invention provides a method of performing a magnetic resonance imaging (MRI) reference scan of an examination volume comprising a plurality of image points, the method being performed using a set of detector elements, the method comprising a phase sensitive acquisition of a first and a second complex echo signal originating from a first and second echo from each image point, wherein the acquisition is performed by each of the detector elements of the set of detector elements. The method further comprises determining for a detector element of the set of detector elements a phase difference between the first and the second echo signal for each image point and calculating from the phase difference a local field inhomogeneity value for each image point. The method further comprises calculating for each image point a coil sensitivity matrix, wherein the coil sensitivity matrix relates to the first or the second complex echo signals acquired by the set of elements to each other.

Embodiments of the invention have the advantage, that in only one reference scan, a volumetric map of field inhomogeneity values is obtained, and that additionally using said reference scan at the same time a coil sensitivity matrix can be calculated for each image point. This means, that a volumetric map of ratios of coil sensitivities and a volumetric map of field inhomogeneity values are obtained in one single scan. Hence, since only one single scan is required to retrieve both volumetric maps of field inhomogeneities and coil sensitivities, the measurement time for the reference scan is reduced. This in turn reduces the overall length of time a patient has to stay within the magnetic resonance imaging system. This increases the convenience of patients and also increases the throughput number of patients.

In accordance with an embodiment of the invention, the method further comprises calculating for at least one of the image points a coil timing matrix, wherein the coil timing matrix relates the first complex echo signal to the second complex echo signal acquired by each detector element of the set of elements.

This has the advantage, that an additional reference scan to get further information about coil timings can be avoided. Again, only one single reference scan according to the invention is required in order to also additionally obtain information about coil timing issues.

In accordance with an embodiment of the invention, the echoes are gradient echoes generated using an encoding magnetic field gradient. Preferably, the difference between the echo times is selected such that for two predetermined chemical shift values the first and second echo are basically in phase. For example, the two chemical shift values are the chemical shift values of watery tissue and fat. Human tissues do have significant variation in chemical shift, most notably the difference in frequency between watery tissue and fat. In practice this means by applying the method of performing the reference scan according to the invention, a phase difference between the first and the second echo signal may be wrongly interpreted as a local magnetic field inhomogeneity and not be recognized as just a presence of for example fat. This problem is solved by selecting the difference between the echo times in such a manner, that in the example of watery tissue and fat the first and the second echo are basically in phase independent of the presence of watery tissue or fat. For a magnetic field of 3 T, the difference between the two echo times should be around 2.3 milliseconds.

In accordance with an embodiment of the invention, the first echo is generated by a first RF pulse and an encoding magnetic field gradient and a second echo is generated by a second RF pulse and a further encoding magnetic field gradient. This allows to establish a simple and straight forward pulse sequence comprising the first and second RF pulse as well as the necessary encoding magnetic field gradients.

In accordance with an embodiment of the invention, the first echo is generated by a reference scan sequence comprising an RF pulse and an encoding magnetic field gradient and a second echo is generated by said RF pulse and a further encoding magnetic field gradient resulting from a repeated execution of the reference scan sequence. In this embodiment, only one RF pulse is used to generate the first and the second echo, wherein the first and the second echo is generated by a respective switching of the encoding magnetic field gradients. Such a reference scan sequence has the advantage, that in case a compensation for chemical shift values due to for example watery tissue and fat needs to be provided, the repetition time of execution of such a pulse sequence can be significantly reduced compared to a "two pulse" sequence. Thereby, the second echo is actually the echo of the excitation of the previous shot, which can be achieved by appropriate switching of the encoding magnetic field gradients. In that way, the difference between the two echo times can be slightly more than the repetition time of the reference scan sequence.

In accordance with an embodiment of the invention, the repetition time of the reference scan sequence is shorter than the echo time between the RF pulse generating the second echo and the second echo itself.

In accordance with an embodiment of the invention, the encoding magnetic field gradient comprises a first gradient temporarily applied after the RF pulse, the first gradient having a first gradient area resulting from a first polarity, first magnitude and first duration. The encoding magnetic field gradient further comprises a second gradient temporarily applied subsequent to the finished application of the first gradient, the second gradient having a gradient area comprising the inverted first gradient area, a second and a third gradient area, the second gradient area resulting from a second polarity, second magnitude and second duration, wherein the second polarity corresponds to the inverted first polarity, the third gradient area resulting from a third polarity, third magnitude and third duration, wherein the third polarity corresponds to the inverted first polarity. The encoding magnetic field gradient further comprises a third gradient temporarily applied subsequent to the finished application of the second gradient, the third gradient having a gradient area comprising two times the inverted second gradient area and the inverted third gradient area.

Using this temporarily arranged sequence of encoding magnetic field gradients allows, that the time difference between the first and the second echo can be longer than the repetition time of the reference scan sequence itself.

In accordance with an embodiment of the invention, the magnetic field gradient is a frequency encoding gradient.

In accordance with an embodiment of the invention, the method further comprises applying a set of phase encoding gradients. This phase-encoding may extend in one or two dimensions. This set of phase encoding gradients is applied with a predetermined polarity during the application of the first gradient and the set of phase encoding gradients is applied with the inverted predetermined polarity during the application of the third gradient. Hence, using such a two-dimensional phase encoding an image or volume can be reconstructed both from the first and the second echo responses neglecting chemical shifts due to for example the presence of fat in a predefined manner. Therewith, a volumetric map of field inhomogeneity values can be provided.

In accordance with an embodiment of the invention, the RF pulse has a pulse angle below 10°, preferably below 2°. With such an assumption that all RF pulses have very small angles, RF refocused and stimulated echoes are negligible compared to the direct echoes, i.e., the gradient echoes. Also by using only RF pulses with small pulse angles, the repetition time can be kept fairly short and relaxation issues do not have to be considered explicitly.

In a further aspect, the invention relates to a magnetic resonance imaging apparatus adapted for reference scanning of an examination volume comprising a plurality of image points, the apparatus comprising a set of detector elements, the apparatus further comprising means for phase sensitive acquisition of a first and a second complex echo signal originating from a first and second echo for each image point, wherein each of the detector elements of the set of detector elements is adapted for the acquisition. The apparatus further comprises means for determining for a detector element of the set of detector elements a phase difference between the first and the second echo signal for each image point. The apparatus further comprises means for calculating from a phase difference a local field inhomogeneity value for each image point and means for calculating for each image point a coil sensitivity matrix, wherein the coil sensitivity matrix relates the first or the second complex echo signals acquired by the set of elements to each other.

In a further aspect, the invention relates a computer program product comprising computer executable instructions for performing the method according to the invention.

BRIEF DESCRIPTION OF THE DRAWINGS

In the following preferred embodiments of the invention are described in greater detail by way of example only making reference to the drawings in which.

DETAILED DESCRIPTION OF THE EMBODIMENTS

Figure 1:
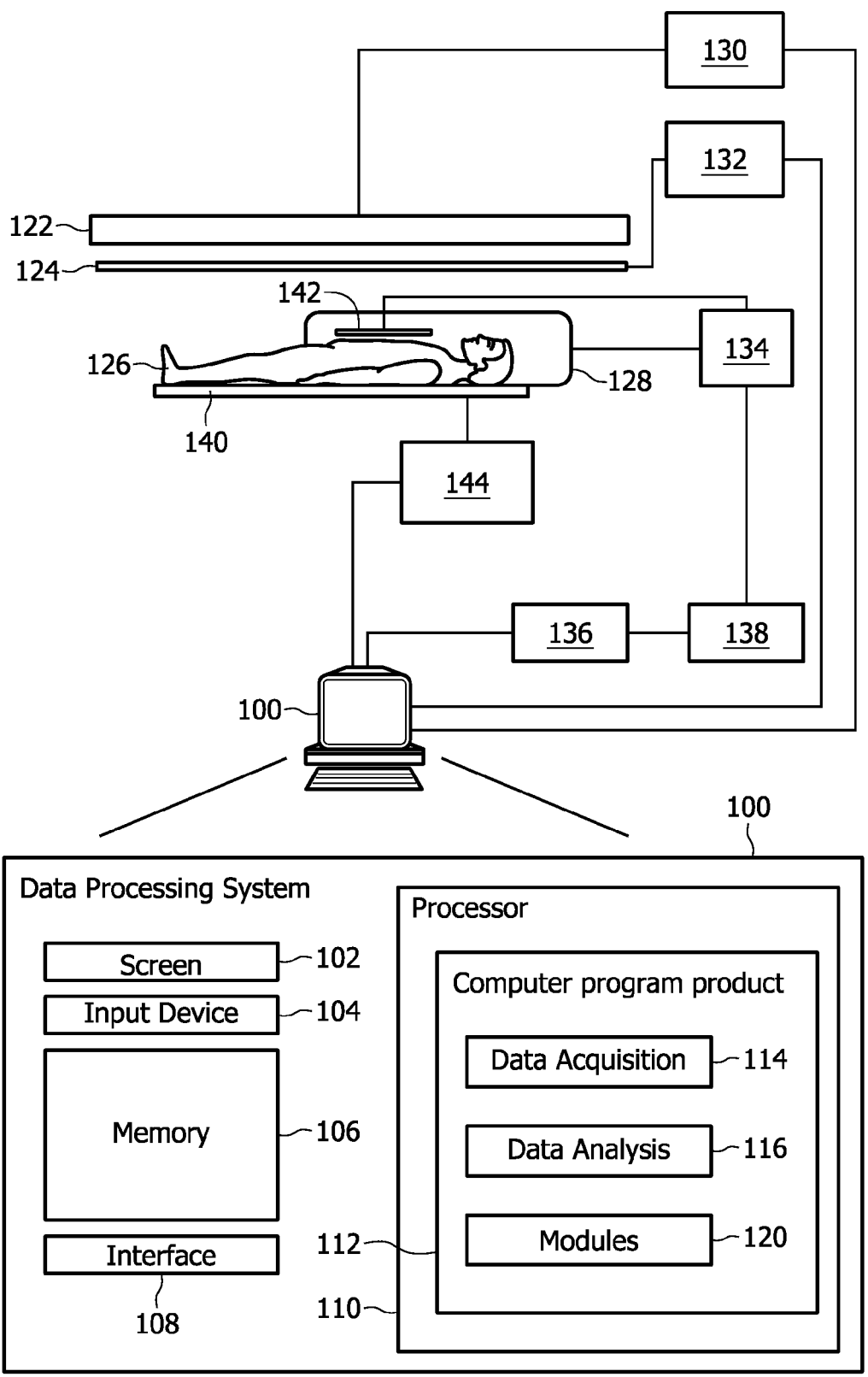
FIG. 1 is a block diagram of an embodiment of a magnetic resonance imaging apparatus.

FIG. 1 is a block diagram of an embodiment of a magnetic resonance imaging apparatus. Only major components of a preferred MRI system which incorporates the present invention is shown in FIG. 1. The magnetic resonance imaging apparatus comprises a data processing system 100, whereby the data processing system 100 typically comprises a computer screen 102, an input device 104 which could be for example a keyboard and a mouse. The MRI system in FIG. 1 further comprises a memory 106 and an interface 108. Thereby, the interface 108 is adapted for communication and data exchange with typical hardware MRI components.

These hardware components comprise for example a main field control unit 130 adapted for controlling the main field of the magnetic 122. The main field magnet 122 may thereby be adapted as a permanent superconducting magnet or being externally driven and switched on and off for each individual usage of the MRI system. The interface 108 further communicates with a gradient coil control unit 132, wherein respective gradient coils 124 are preferably self-shielded gradient coils for producing gradients along three mutual axis x, y and z. The MRI system further comprises an RF coil 128 electrically connected to an RF control unit 134. Thereby, the RF coil 128 is preferably adapted as an integrated body coil integrated in the magnet bore.

Using an RF generator 138, an RF pulse sequence is generated under the control of the data processing system 100 and therewith for example protons in the body 126 of a person are excited in a predefined manner. The resulting magnetic resonance signal is then detected by for example a surface coil 142 and amplified by means of the amplifier 136. This is followed by processing of an acquired RF signal by special hardware components like detectors, mixers etc., well known in the art and not shown here. Thereby, such hardware components can be adapted as additional external hardware units or be implemented into the data processing system 100.

The interface 108 is further connected to a bed control unit 144, adapted to control the movement of a bed 140 a patient 126 being positioned on. Thereby, the bed is adapted to move the patient in the direction towards the image acquisition region of the body coil 128.

The data processing system 100 further comprises a processor 110 being adapted to execute computer executable instructions of a computer program product 112. In the present embodiment, the data processing system 100 comprises a computer program product 112 by means of the data acquisition module, which is adapted to control the hardware units 122-124 and 128-144. Data acquisition is performed and the acquired data is analyzed by the data analysis module 116 for image reconstruction.

The computer program product 112 further comprises various modules 120. These modules can for example be adapted for determining for a given detector element of the set of detector elements 142 a phase difference between acquired echo signals for a given image point. They may also comprise a module which is adapted for calculating from the phase difference a local magnetic field inhomogeneity value for each image point. Also a module may be comprised which is adapted for calculating for each image point a coil sensitivity matrix, wherein the coil sensitivity matrix relates echo signals acquired by the set of detector elements 142 to each other. Hence, such a module is adapted to generate a volumetric map of ratios of coil sensitivities.

Figure 2:
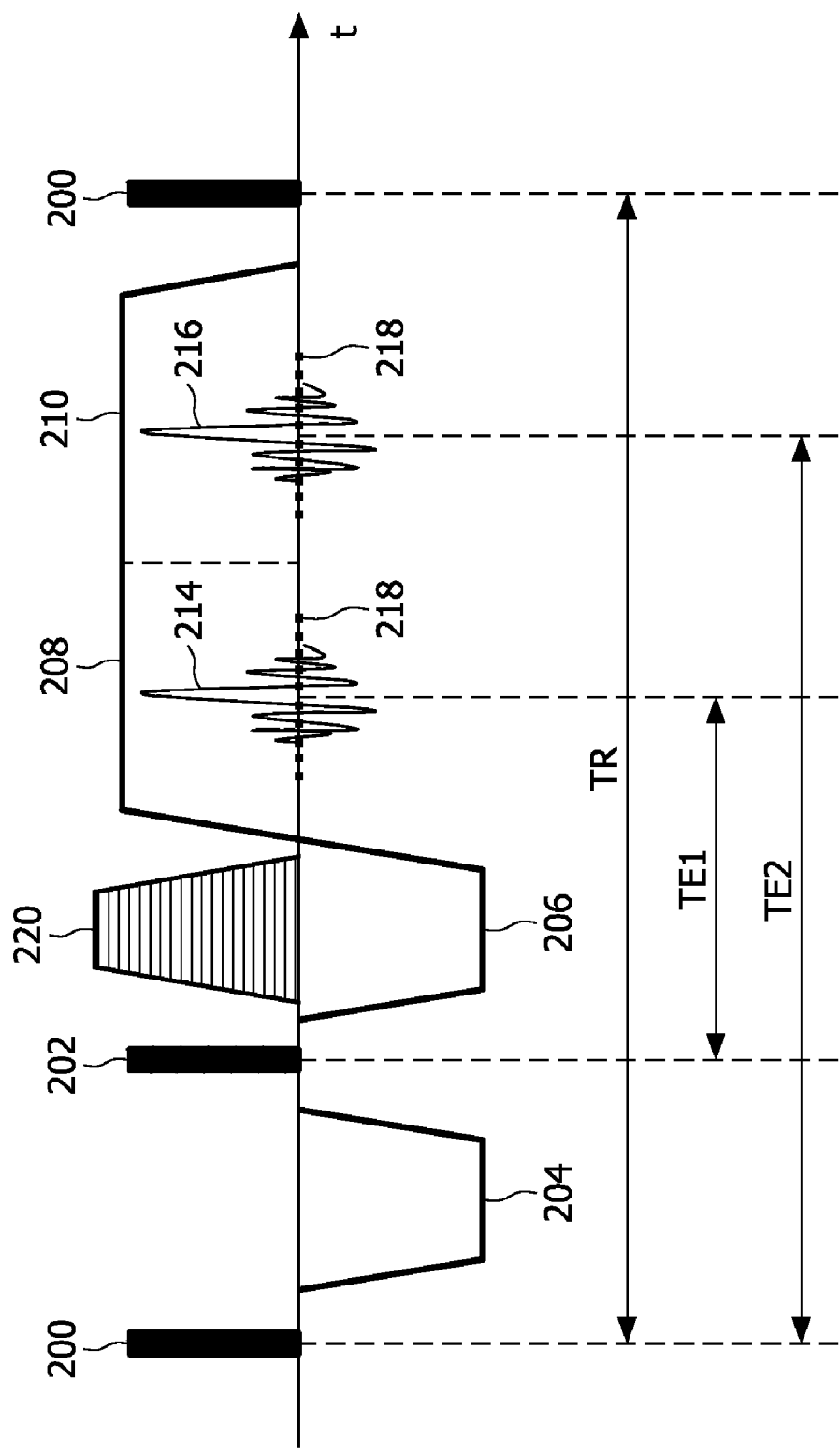
FIG. 2 shows a timing sequence for performing the method of a reference scan according to the invention.
Figure 3:
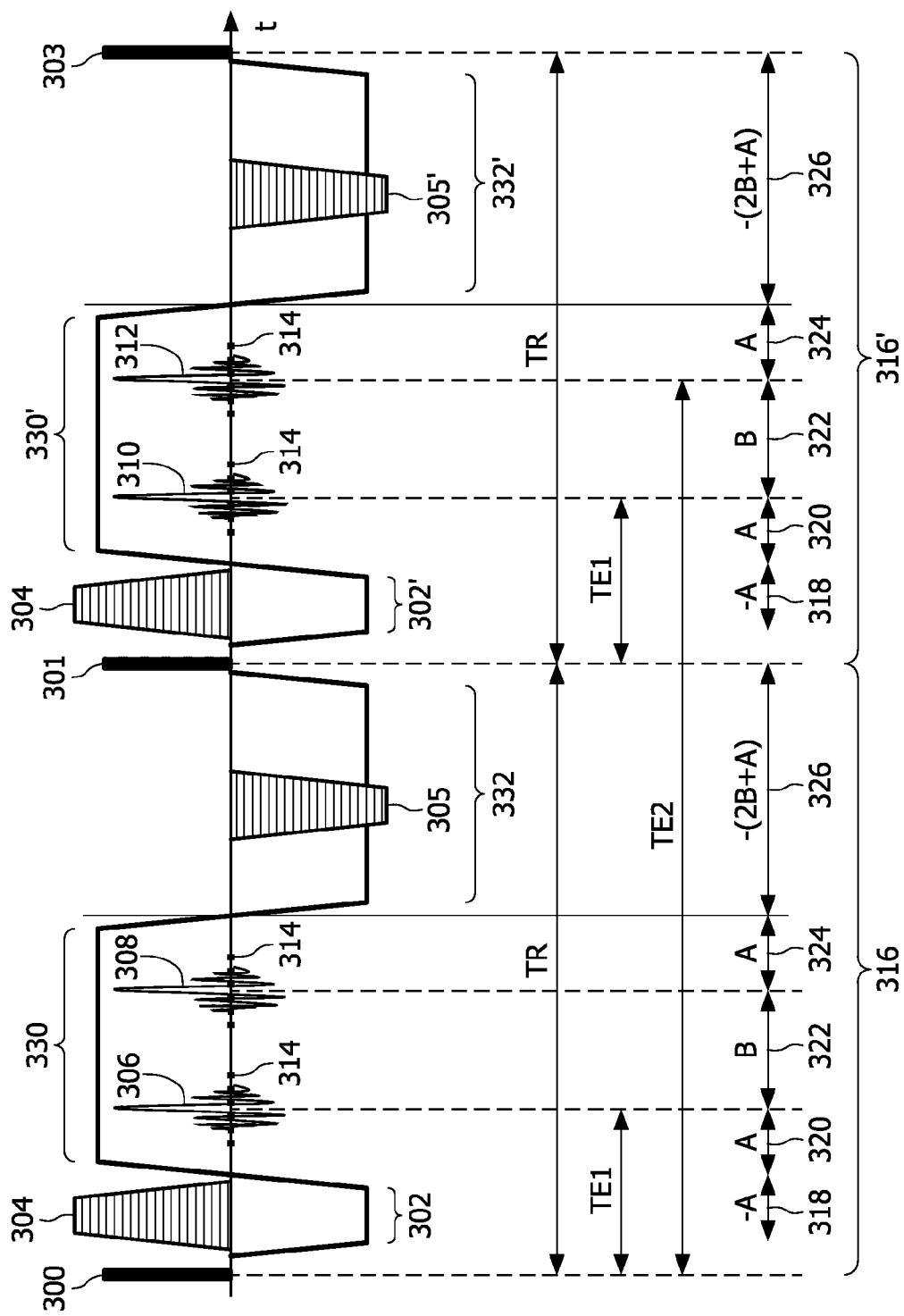
FIG. 3 shows a further timing sequence for performing the method of a reference scan according to the invention.

In order to perform the method according to the invention in an exemplary manner, a patient is first positioned on the moveable bed 140. Then the bed is moved using the bed control unit 144 into the magnet bore comprising the detector elements in form of a surface coil 142. Using the computer program product 112, a respective pulse sequence as later on depicted in FIGS. 2 and 3 is generated which also comprises control commands for the gradient coils control unit 132. Using the set of detector elements 142, a phase sensitive acquisition of a first and a second complex echo signal originating from a first and second echo for each image point in the examined volume within the magnet bore is performed, wherein the acquisition is performed by each of the detector elements of the set of detector elements 142. Using one of the modules 120, for a detector element of the set of detector elements the phase difference between the first and the second echo signal for each image point is determined. This allows in a further step to obtain a volumetric map of magnetic field inhomogeneity values by calculating from the phase difference a local magnetic field inhomogeneity value for each image point. Also, using the same acquired complex echo signals for each image point a coil sensitivity matrix is calculated by means of one of the modules 120, wherein the coil sensitivity matrix relates the first or the second complex echo signals acquired by the set of elements to each other. Further, by again using the same acquired first and second complex echo signals for at least one of the image points a coil timing matrix is calculated by means of one of the modules 120, wherein the coil timing matrix relates the first complex echo signal to the second complex echo signal acquired by each detector element of the set of elements 142.

It has to be mentioned, that the method according to the invention can be carried out using either selective or non-selective excitation pulses. The advantage of slab-selective pulses is that, in principle the scan time can be made shorter if only a portion of the body of the patient 126 is of special interest.

FIG. 2 shows a timing sequence for performing the method of a reference scan according to the invention. Thereby, the timing sequence comprises a pulse sequence which consists of two pulses 200 and 202. These two pulses 200 and 202 are RF pulses which are separated in time by application of a frequency encoding gradient 204. Directly after application of the second RF pulse 202, a further frequency encoding gradient 206 with the same polarity, magnitude and duration as the frequency encoding gradient 204 is applied. Thereafter, a further frequency encoding gradient 208 is applied, this time with inverted polarity but same magnitude and duration as the frequency encoding gradient 206. This results in the formation of a gradient echo 214, which originates from the RF pulse 202 and the frequency encoding gradients 206 and 208 which are compensated at the time of appearance of the echo 214.

After the frequency encoding gradient 208, a further frequency encoding gradient 210 is applied which in the present example corresponds to the frequency encoding gradient 208. However, in general the frequency encoding gradient 210 needs to have the inverse polarity of the frequency encoding gradient 204, but the same gradient area (which is gradient magnitude times gradient duration) as the frequency encoding gradient 204. This leads at the time TE2 to the formation of a second gradient echo 216. Summarizing, this second gradient echo 216 is due to the RF pulse 200 and the phase encoding gradients 204 and 210 which compensate each other.

The timing sequence of FIG. 2 further shows the sampling 218 at which acquisition of the RF magnetic resonance signals in form of the echoes 214 and 216 is performed. The sequence in FIG. 2 further shows the phase encoding gradient 220 which is necessary for obtaining a three-dimensional spatial assignment of the echoes 214 and 216 to image points of the imaged examination volume.

The sequence depicted in FIG. 2 is repeated after termination of the frequency encoding gradient 210. Therewith, the sequence in FIG. 2 has a repetition time TR which is given by the distance in time between the first pulse 200 and the termination of the frequency encoding gradient 210.

Assuming that the sequence depicted in FIG. 2 is only carried out for one point in space and only one receiving coil, by analyzing the complex amplitude and phase of the echoes 214 and 216 a local magnetic field inhomogeneity can be determined.

Referring back to the problem mentioned above, that chemical shift variations due to the difference in chemical shifts of watery tissue and fat may be misinterpreted as local magnetic field inhomogeneities, in order to solve this problem the distance in time with two echo times TE1 and TE2 needs to satisfy a certain condition. For example in the case of a main magnet operating at a magnetic field of $B_0=3$ T, the chemical shift of fat with respect to water is around 400 Hz. This means, that around every 2.5 milliseconds an echo resulting from watery tissue will correspond to an echo resulting from fat with respect to the complex phase. Applying this knowledge to FIG. 2 this means, that in order to obtain the same complex phase for the echoes 214 and 216 independently if they originate from water or fat, the difference between the two echo times should be around 2.5 milliseconds. However, the aim is to keep TR (the repetition time) as short as possible, which in practice should be below 2 milliseconds, in order to allow for a fast performance of the reference scan of the examination volume. This cannot be achieved with the difference between the two echo times around 2.5 milliseconds.

This leads to FIG. 3 which shows a further timing sequence for performing the method of a reference scan according to the invention. Compared to FIG. 2, the reference scan sequence 316 comprises only one single RF pulse 300. The RF pulses 301 and 303 depicted in FIG. 3 belong to further subsequent reference scan sequences 316. In FIG. 3 two reference scan sequences 316 and 316' are shown.

The RF pulse 300 results in a gradient echo 306 and also a gradient echo 312. However, the gradient echo 312 only appears after execution of the reference scan sequence 316 a second time (by means of the sequence 316'). This is explained in detail now:

In a first step, the RF pulse 300 is applied. Thereupon, a frequency encoding gradient 302 is turned on, wherein said gradient 302 has a first gradient area −A resulting from an integration of the polarity, magnitude and duration of said gradient 302.

Thereafter, a further gradient 330 is temporarily applied subsequent to the finished application of the gradient 302. This gradient 330 has a gradient area which consists of three areas 320 (area size +A), area 322 (area size +B) and area 324 (area size +A). Thereby, the gradient area 320 corresponds to the inverted gradient area 318 of the frequency encoding gradient 302. This has the effect, that as soon as the gradient 330 has reached a gradient area which corresponds to the gradient area of the gradient 302, the frequency encoding gradients are compensated. As a result, the echo 306 forms at the echo time TE1. The echo 306 is then read out using the sampling 314.

For the sake of simplicity, the echo 308 shall be neglected right now but discussed later. As mentioned above, the frequency encoding gradient 330 comprises the gradient area 322 with area size B and gradient area 324 with area size A. Thereby, the areas 322 and 324 have the same polarity as the area 320.

A further gradient 332 is applied temporarily subsequent to the finished application of the gradient 330. This gradient 332 has a gradient area 326 with an integrated area size −(2B+A). The reason for the selection of this size shall also be understood later.

The reference scan sequence 316 further comprises two phase encoding gradients 304 and 305. Thereby, the phase encoding gradient 304 is applied timely in parallel to the application of the frequency encoding gradient 302. The phase encoding gradient 305 is applied during the application of the frequency encoding gradient 332. Compared to the phase encoding gradient 304, the phase encoding gradient 305 has an inverted polarity, such that the phase encoding gradients are compensated before the subsequent RF pulse 301 of the next scan sequence 316'.

The reference scan sequence 316 is repeated as reference scan sequence 316' which starts again with the application of the RF pulse 301 which corresponds to the RF pulse 300. As already explained above, the design of the frequency encoding gradient 302 and the frequency encoding gradient 330 (especially the gradient area 320) leads to the formation of a gradient echo 310. This gradient echo 310 thereby corresponds to the gradient echo 306. At a time TE2 with respect to the time where the first RF pulse 300 was applied, a further echo 312 forms. This echo 312 which is also a gradient echo is the result of the RF pulse 300 as well as the gradients 302, 330, 332, 302' and 330'. This can be understood by considering the gradient areas depicted on the bottom of FIG. 3. Thereby it becomes clear, that at the time TE2 the above mentioned frequency encoding gradients are compensated to zero. Such a compensation leads to the formation of a gradient echo, in the example of FIG. 3 to the formation of the gradient echo 312.

Extending the timing sequence of FIG. 3 to the left now also explains the appearance of the echo 308. The echo 308 is the result of compensated frequency encoding gradients and an RF pulse which was applied just before the RF pulse 300 in a previous reference scan sequence.

In order to overcome the problem that human tissues do have significant variation in chemical shift, especially due to the difference in frequency between watery tissue and fat, the echoes 306 and 312 can be forced in phase if the difference TE2−TE1 of the two echo times corresponds to the inverted frequency difference between for example watery tissue and fat, which is for 3 T around 2.5 milliseconds. However, even though TE2−TE1 is around 2.5 milliseconds, the repetition time TR of the reference scan sequence 316 can still be kept lower than the difference between the two echo times.

It has to be noted, that it is also possible to arrange the depicted sequence in such a way that the second echo is measured as a response of two shots ago, in order to achieve a theoretic echo time difference of 5 milliseconds for a repetition time of 2 milliseconds for example. This may for example be necessary for lower magnetic fields like 1.5 T, where the frequency difference due to the chemical shift between watery tissue and fat is about 200 Hz which corresponds to a necessary time difference in the appearance of the echoes of 5 milliseconds in order to guarantee that the two echoes are in phase. In this case, the frequency encoding gradients are arranged in such a manner that the second echo appears during the third executed repetition of the reference scan sequence 316.

Referring back to FIG. 3, for obtaining a volumetric map of field inhomogeneity values, the first and the second echo phases are compared to each other, which means that the echo 306 is compared to the echo 312. For a determination of a coil sensitivities, the echo 306 obtained by one coil is compared to the echo 306 acquired by a further coil. In theory, for the same point in space in the examination volume both coils should result in exactly the same signal output, which means that by forming the ratio between the signal output of the two coils said ratio should be equal 1. However, in practice since one coil might be farther away than the other coil from the point in space which results the echo signal 306, the signal from the coil being farther away may be simply larger than a signal from the coil which is closer to the signal source. Therewith, the ratio between these two signals does not equal any more than 1. Extending that concept of ratios to a multitude of coils, for one given point in space a multitude of ratios of amplitudes of echo signals is obtained. However, this is not simply restricted to an amplitude but may also comprise a complex value, i.e., amplitude and phase. This leads for one point in space to an array of sensitivities, which extended to a whole examination volume comprising a multitude of points in space results in a complex coil sensitivity matrix.

For calculation of the coil sensitivity matrix, of course any echoes within one given set of echoes can be related to each other. This means that for example all echoes 306 detected by all coil elements can be related to each other, all echoes 312 detected by all coil elements can be related to each other etc.

For coil timing issues, the magnitudes of the echo 306 and the echo 312 should be compared to each other for a given coil. Neglecting for relaxation effects which are usually much longer in time than TE2 corresponds to, in case detector elements reach immediately after being turned on after application of the pulses 300 and 301 their maximum sensitivity, the magnitudes of the echo 306 and 312 should be equal. However, in case a detector element needs a certain time in order to reach the maximum sensitivity to detect echo signals, said sensitivity may still not have been reached after the time TE1 which is the time when the echo 306 appears after application of the RF pulse 300, but it may have been reached after the time the echo 312 appears after application of the RF pulse 301. In this case, the ratio of the magnitudes of the echo amplitude of the echo 306 and the amplitude of the echo 312 are not equal. Therewith, this gives an information about the coil timing. Such type of effect is difficult to measure in other ways than such a dual echo comparison depicted in FIG. 3.

Figure 4:
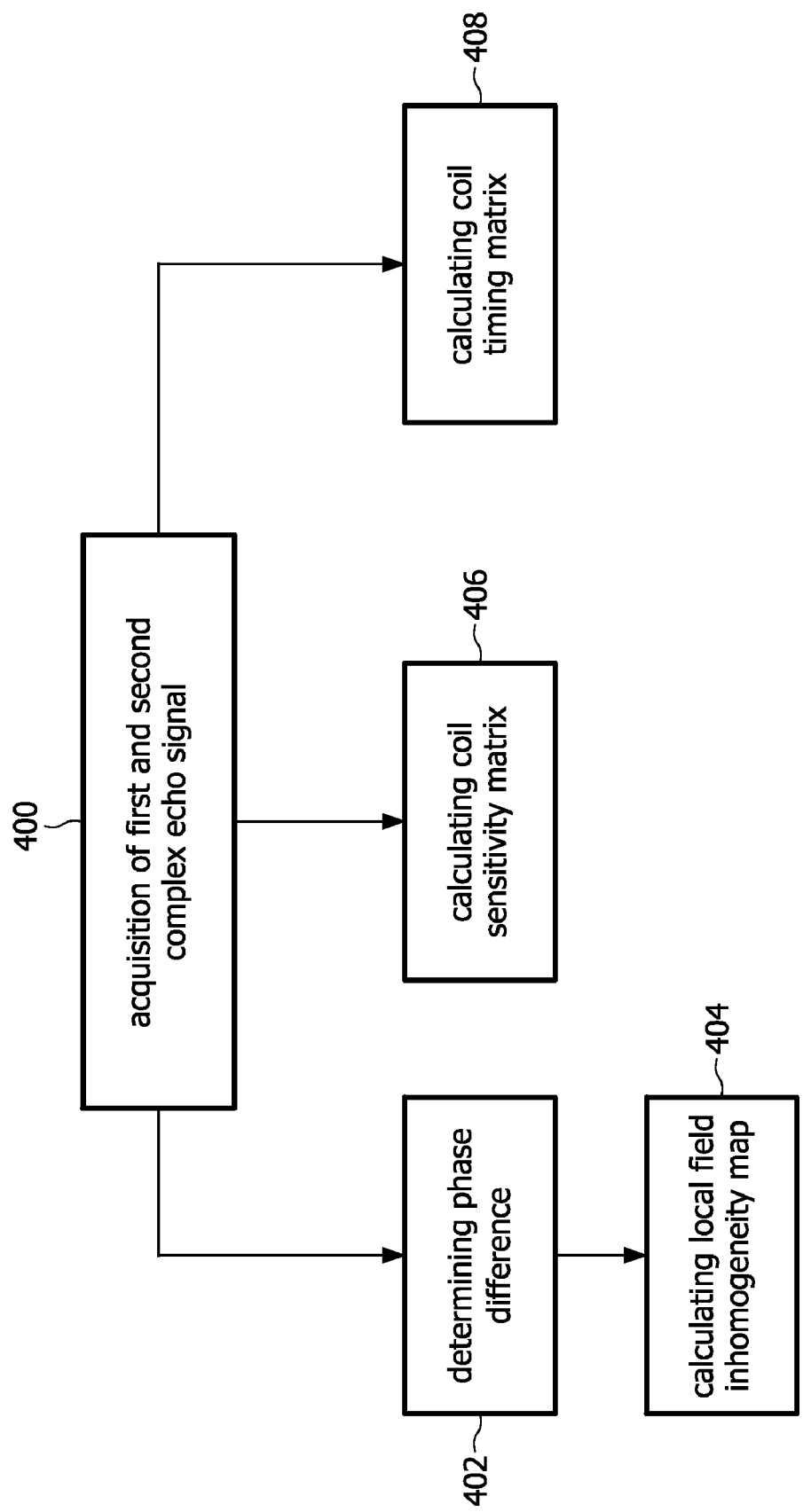
FIG. 4 shows a flow chart illustrating a method of a reference scan according to the invention.

FIG. 4 shows a flowchart illustrating a method of a reference scan according to the invention. In step 400, a phase sensitive acquisition of a first and a second complex echo signal originating from a first and second echo for each image point of an examination volume comprising a plurality of image points is performed by each of the detector elements of a set of detector elements of a magnetic resonance imaging apparatus.

After step 400, three different ways of analysis of the acquired echo signals are given. One possibility is that in step 402 a phase difference between the first and second complex echo signal is determined, which allows in the subsequent step 404 to calculate a local magnetic field inhomogeneity map. Alternatively, after step 400 using either the first or the second complex echo signals acquired by the set of elements for each image point a coil sensitivity matrix can be calculated.

Yet in a further alternative, after step 400 in step 408 a coil timing matrix can be calculated by relating the first complex echo signal to the second complex echo signal acquired by each detector element of the set of elements.

LIST OF REFERENCE NUMERALS

100 Data Processing System
102 Screen
104 Input Device
106 Memory
108 Interface
110 Processor
112 Computer Program Product
114 Module
116 Module
120 Module
122 Main Magnet
124 Gradient Coil
126 Patient
128 RF Body Coil
130 Main Field Control Unit
132 Gradient Coils Control Unit
134 RF Coils Control Unit
136 Amplifier
138 RF Generator
140 Bed
142 Surface Coil
144 Bed Control Unit
200 Pulse
202 Pulse
204 Frequency encoding gradient
206 Frequency encoding gradient
208 Frequency encoding gradient
210 Frequency encoding gradient
214 Echo
216 Echo
218 Sampling
220 Phase encoding gradient
300 Pulse
301 Pulse
302 Frequency encoding gradient
303 Pulse
304 Phase encoding gradient
305 Phase encoding gradient
306 Echo
308 Echo
310 Echo
312 Echo
314 Sampling
316 Reference scan sequence
318 Area
320 Area
322 Area
324 Area
326 Area
330 Frequency encoding gradient
332 Frequency encoding gradient

The invention claimed is:

1. A method of performing a magnetic resonance imaging (MRI) reference scan of an examination volume comprising a plurality of image points, the method being performed using a set of detector elements, the method comprising:
   phase sensitive acquisition of a first and a second complex echo signal originating from a first and second echo for each image point, wherein the acquisition is performed by each of the detector elements of the set of detector elements,
   determining for a detector element of the set of detector elements a phase difference between the first and the second echo signal for each image point,
   calculating from the phase difference a local magnetic field inhomogeneity value for each image point,
   deriving for each image point a coil sensitivity matrix, wherein the coil sensitivity matrix is derived by calculating complex ratios of the first or the second complex echo signals acquired by the set of elements, and
   wherein the echoes are gradient echoes generated using an encoding magnetic field gradient.

2. The method of claim 1, further comprising deriving for at least one of the image points a coil timing matrix, wherein the coil timing matrix is derived by calculating a ratio of the first complex echo signal to the second complex echo signal acquired by each detector element of the set of elements.

3. The method of claim 1, wherein the reference scan comprises an RF pulse, wherein the RF pulse has a pulse angle below 10 degrees.

4. The method of claim 1, wherein the difference between the echo times is selected such that for two predetermined chemical shift values the first and the second echo are basically in phase.

5. The method of claim 1, wherein the first echo is generated by a first RF pulse and an encoding magnetic field gradient, and the second echo is generated by a second RF pulse and a further encoding magnetic field gradient.

6. The method of claim 5, wherein the magnetic field gradient is a frequency encoding gradient.

7. The method of claim 6, further comprising applying a set of phase encoding gradients, wherein
the set of phase encoding gradients is applied with a predetermined polarity during the application of the first gradient and
the set of phase encoding gradients is applied with the inverted predetermined polarity during the application of the third gradient.

8. The method of claim 1, wherein
the first echo is generated by a first execution of a reference scan sequence comprising an RF pulse and an encoding magnetic field gradient,
the second echo is generated by said RF pulse applied with said first execution of said reference scan sequence and a further encoding magnetic field gradient resulting from a repeated execution of the reference scan sequence.

9. The method of claim 8, wherein the repetition time of the reference scan sequence is shorter than the echo time between the RF pulse generating the second echo and the second echo itself.

10. The method of claim 8, wherein the encoding magnetic field gradient comprises
a first gradient temporally applied after the RF pulse, the first gradient having a first gradient area resulting from a first polarity, first magnitude and first duration,
a second gradient temporally applied subsequent to the finished application of the first gradient, the second gradient having a gradient area comprising the inverted first gradient area, a second and a third gradient area, the second gradient area resulting from a second polarity, second magnitude and second duration, wherein the second polarity corresponds to the inverted first polarity, the third gradient area resulting from a third polarity, third magnitude and third duration, wherein the third polarity corresponds to the inverted first polarity,
a third gradient temporally applied subsequent to the finished application of the second gradient, the third gradient having a gradient area comprising two times the inverted second gradient area and the inverted third gradient area.

11. A computer program product comprising computer executable instructions for performing any of the method steps according to claim 1.

12. A magnetic resonance imaging apparatus adapted for reference scanning of an examination volume comprising a plurality of image points, the apparatus comprising a set of detector elements, the apparatus further comprising:
means for phase sensitive acquisition of a first and a second complex echo signal originating from a first and second echo for each image point, wherein each of the detector elements of the set of detector elements is adapted for the acquisition,
means for determining for a detector element of the set of detector elements a phase difference between the first and the second echo signal for each image point,
means for calculating from the phase difference a local magnetic field inhomogeneity value for each image point,
means for deriving for each image point a coil sensitivity matrix, wherein the means for deriving the coil sensitivity matrix are adapted to derive the coil sensitivity matrix by calculating complex ratios of the first or the second complex echo signals acquired by the set of elements, and
wherein the echoes are gradient echoes generated using an encoding magnetic field gradient.

13. The apparatus of claim 12, further comprising means for deriving for at least one of the image points a coil timing matrix, wherein the means for deriving the coil timing matrix are adapted to derive the coil sensitivity matrix by calculating a ratio of the first to the second complex echo signal acquired by each detector element of the set of elements.

14. The apparatus of claim 12, further comprising means for generating an encoding magnetic field gradient and an RF pulse generator, wherein the means for generating the encoding magnetic field gradient and the RF pulse generator are adapted to
generate the first echo by a reference scan sequence comprising an RF pulse and an encoding magnetic field gradient,
generate the second echo by said RF pulse and a further encoding magnetic field gradient resulting from a repeated execution of the reference scan sequence.

* * * * *